United States Patent
Huang et al.

(10) Patent No.: US 9,634,687 B2
(45) Date of Patent: Apr. 25, 2017

(54) VCO-BASED CONTINUOUS-TIME SIGMA DELTA MODULATOR EQUIPPED WITH TRUNCATION CIRCUIT AND PHASE-DOMAIN EXCESS LOOP DELAY COMPENSATION

(71) Applicant: MEDIATEK INC., Hsin-Chu (TW)

(72) Inventors: Sheng-Jui Huang, Hsinchu (TW); Michael A. Ashburn, Jr., Groton, MA (US); Divya Kesharwani, Woburn, MA (US); Nathan Egan, Burlington, MA (US)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/069,951

(22) Filed: Mar. 14, 2016

(65) Prior Publication Data
US 2016/0365870 A1    Dec. 15, 2016

Related U.S. Application Data

(60) Provisional application No. 62/173,377, filed on Jun. 10, 2015.

(51) Int. Cl.
*H03M 3/00* (2006.01)
(52) U.S. Cl.
CPC .......... *H03M 3/422* (2013.01); *H03M 3/464* (2013.01)
(58) Field of Classification Search
CPC .......... H03M 3/454; H03M 1/00; H03M 3/30; H03M 3/368; H03M 3/438; H03M 1/12

(Continued)

(56) References Cited

U.S. PATENT DOCUMENTS

| 8,344,921 B2 | 1/2013 | Lin |
| 8,471,743 B2 * | 6/2013 | Huang ................ H03M 1/502 |
| | | 341/143 |

(Continued)

OTHER PUBLICATIONS

Park, et al., "A 78 dB SNDR 87 mW 20 MHz Bandwidth Continuous-Time ΔΣ ADC With VCO-Based Integrator and Quantizer Implemented in 0.13 μm CMOS", IEEE Journal of Solid-State Circuits, vol. 44, No. 12, Dec. 2009, pp. 3344-3358.

(Continued)

*Primary Examiner* — Linh Nguyen
(74) *Attorney, Agent, or Firm* — Winston Hsu; Scott Margo

(57) ABSTRACT

A continuous-time sigma-delta modulator includes a VCO-based quantizer, a rotator, a truncation circuit and a digital-to-analog converter (DAC). The VCO-based quantizer is arranged to generate a thermometer code based on an input signal and a feedback signal. The rotator is coupled to the VCO-based quantizer, and is arranged to generate a phase-shifted thermometer code based on the thermometer code and a phase shift, and generate a rearranged thermometer code based on the phase-shifted thermometer code to comply with a specific pattern. The truncation circuit is coupled to the rotator, and is arranged to extract a most significant bit (MSB) part from the rearranged thermometer code. The DAC is coupled to the truncation circuit, and is arranged to generate the feedback signal according to at least the MSB part. Two alternative continuous-time sigma-delta modulators are also disclosed.

25 Claims, 13 Drawing Sheets

(58) Field of Classification Search
USPC .......................................................... 341/143
See application file for complete search history.

(56) References Cited

U.S. PATENT DOCUMENTS

| | | | | |
|---|---|---|---|---|
| 8,593,318 B2* | 11/2013 | Kaald | ..................... | H03M 3/37 |
| | | | | 341/143 |
| 2002/0175846 A1* | 11/2002 | Sakimura | .............. | H03M 3/428 |
| | | | | 341/143 |
| 2005/0068213 A1* | 3/2005 | Fontaine | ................. | H03M 3/37 |
| | | | | 341/143 |
| 2010/0066577 A1* | 3/2010 | Huang | .................. | H03F 1/0277 |
| | | | | 341/143 |
| 2012/0112943 A1* | 5/2012 | Lin | ......................... | H03M 3/30 |
| | | | | 341/143 |
| 2013/0342377 A1* | 12/2013 | Lin | ......................... | H03M 1/12 |
| | | | | 341/143 |
| 2014/0247169 A1* | 9/2014 | Pinna | ..................... | H03M 3/39 |
| | | | | 341/110 |

OTHER PUBLICATIONS

Tsai, et al., "A 64-fJ/Conv.-Step Continuous-Time ΔΣ Modulator in 40-nm CMOS Using Asynchronous SAR Quantizer and Digital ΔΣ Truncator", IEEE Journal of Solid-State Circuits, vol. 48, No. 11, Nov. 2013, pp. 2637-2648.

Keller, et al., "A Comparative Study on Excess-Loop-Delay Compensation Techniques for Continuous-Time Sigma-Delta Modulators", IEEE Transactions on Circuits and Systems—I: Regular Papers, vol. 55, No. 11, Dec. 2008, pp. 3480-3487.

* cited by examiner

| bit | Thermometer code | MSB bit | LSB bit |
|---|---|---|---|
| 15 | 0 |   |   |
| 14 | 0 |   |   |
| 13 | 0 |   |   |
| 12 | 0 | 0 |   |
| 11 | 0 |   |   |
| 10 | 0 |   |   |
| 9  | 0 |   |   |
| 8  | 0 | 0 |   |
| 7  | 0 |   |   |
| 6  | 0 |   | 0 |
| 5  | 1 |   | 0 |
| 4  | 1 | 1 | 1 |
| 3  | 1 |   |   |
| 2  | 1 |   |   |
| 1  | 1 |   |   |
| 0  | 1 | 1 |   |

| | coarse tick | thermometer | non-thermometer | MSB | LSB in 0-1 transition | LSB in 1-0 transition |
|---|---|---|---|---|---|---|
| bit 15 | | 0 | 0 | 0 | | |
| | | 0 | 0 | | | |
| | 12 | 0 | 0 | | | |
| | | 0 | 0 | | 0 | |
| | | 0 | 0 | 1 | 0 | |
| | 8 | 0 | 0 | | 0 | |
| | | 0 | 1 | | | |
| | | 0 | 1 | | | |
| | | 0 | 1 | 1 | | |
| | 4 | 1 | 1 | | | 1 |
| | | 1 | 1 | | | 0 |
| | | 1 | 0 | | | 0 |
| bit 0 | 0 | 1 | 0 | 0 | | |
| A | coarse(MSB) | 8 | 8 | 4*2=8 | | |
| B | # of 1 (in 0-1 transition) | 1 | 0 | | 0*1=0 | |
| C | # of 1 (in 1-0 transition) | 0 | 1 | | | 1*1=1 |
| D | offset | -3 | -3 | | | |
| B+C-D | residue(LSB) | -2 | -2 | | | |
| A+B+C-D | VCO output(MSB+LSB) | 6 | 6 | | | |

US 9,634,687 B2

VCO-BASED CONTINUOUS-TIME SIGMA DELTA MODULATOR EQUIPPED WITH TRUNCATION CIRCUIT AND PHASE-DOMAIN EXCESS LOOP DELAY COMPENSATION

CROSS REFERENCE TO RELATED APPLICATIONS

This application claims the benefit of U.S. Provisional Application No. 62/173,377, which was filed on Jun. 10, 2015, and is included herein by reference.

BACKGROUND

The disclosed embodiments of the invention relate to signal processing, and more particularly, to a truncation circuit for a voltage-controlled oscillator (VCO)-based continuous-time sigma-delta modulator (CTSDM).

The VCO-based quantizer (VCOQ) of a VCO-based CTSDM provides a bonus integrator and time domain fine quantization. As the Vdd and the process scale down, the VCO can oscillate faster and provide more phases. Therefore, using the VCOQ in the VCO-based CTSDM can boost the quantizer bit number. In a typical VCO-based CTSDM, the output of the quantizer must be fed back to an analog-to-digital converter (ADC) input summing node as soon as possible. The quantizer requires time (usually half a clock cycle), however, to resolve the analog input data and avoid meta-stability issues. To counter this extra delay, excess loop delay compensation (ELDC) must be applied at the quantizer input as a short cut.

Although VCOQ can provide a quantization bit number up to 7 bits or more, the output is purely thermometer code, and the routing bus and layout of unary digital-to-analog converter (DAC) cells could be overwhelming. In practice, truncation of VCOQ output can reduce DAC complexity. Conventional truncation circuits need to first perform thermometer-to-binary conversion and then perform binary-to-thermometer conversion after signal processing, which erodes the feedback timing budget. A novel scheme is required to get over this bottleneck.

SUMMARY

The invention seeks to mitigate, alleviate or eliminate one or more of the above-mentioned disadvantages. Aspects of the invention provide a truncation circuit for a VCO-based CTSDM, as described in the appended claims.

According to a first aspect of the invention, a continuous-time sigma-delta modulator is disclosed. The continuous-time sigma-delta modulator comprises a VCO-based quantizer, a rotator, a truncation circuit and a digital-to-analog converter (DAC). The VCO-based quantizer is arranged to generate a thermometer code based on a VCO input signal, which can be a loop filter output of a loop filter in some examples, where the loop filter may generate the loop filter output according to an input signal such as the input signal of the continuous-time sigma-delta modulator and according to a feedback signal such as the feedback signal obtained through the DAC. The rotator is coupled to the VCO-based quantizer, and is arranged to generate a phase-shifted thermometer code based on the thermometer code and a phase shift, and generate a rearranged thermometer code based on the phase-shifted thermometer code to comply with a specific pattern. The truncation circuit is coupled to the rotator, and is arranged to extract a most significant bit (MSB) part from the rearranged thermometer code. The DAC is coupled to the truncation circuit, and is arranged to generate the feedback signal according to at least the MSB part. For example, the continuous-time sigma-delta modulator may further comprise an arithmetic circuit that is arranged to generate an intermediate signal according to the input signal of the continuous-time sigma-delta modulator and according to the feedback signal obtained through the DAC, where the intermediate signal may be used as the VCO input signal of the VCO-based quantizer. Examples of the arithmetic circuit may include, but not limited to, an adding circuit and a subtraction circuit.

According to a second aspect of the invention, a continuous-time sigma-delta modulator is disclosed. The continuous-time sigma-delta modulator comprises a VCO-based quantizer, an XOR circuit, a truncation circuit and a digital-to-analog converter (DAC). The VCO-based quantizer is arranged to generate a thermometer code based on a VCO input signal, which can be a loop filter output of a loop filter in some examples, where the loop filter may generate the loop filter output according to an input signal such as the input signal of the continuous-time sigma-delta modulator and according to a feedback signal such as the feedback signal obtained through the DAC. The XOR circuit is arranged to generate a phase-shifted thermometer code by performing an XOR operation on the thermometer code and a phase shift. The truncation circuit is coupled to the XOR circuit, and is arranged to extract a most significant bit (MSB) part from the phase-shifted thermometer code. The DAC is coupled to the truncation circuit, and is arranged to generate the feedback signal according to at least the MSB part. For example, the continuous-time sigma-delta modulator may further comprise an arithmetic circuit that is arranged to generate an intermediate signal according to the input signal of the continuous-time sigma-delta modulator and according to the feedback signal obtained through the DAC, where the intermediate signal may be used as the VCO input signal of the VCO-based quantizer. Examples of the arithmetic circuit may include, but not limited to, an adding circuit and a subtraction circuit.

According to a third aspect of the invention, a continuous-time sigma-delta modulator is disclosed. The continuous-time sigma-delta modulator comprises a VCO-based quantizer, an excess loop delay compensation (ELDC) circuit and a digital-to-analog converter (DAC). The VCO-based quantizer is arranged to generate a thermometer code (e.g. in a phase domain) based on a VCO input signal, which can be a loop filter output of a loop filter in some examples, where the loop filter may generate the loop filter output according to an input signal such as the input signal of the continuous-time sigma-delta modulator and according to a feedback signal such as the feedback signal obtained through the DAC. The ELDC circuit can be generalized as an IIR filter with plurality of taps. The DAC is coupled to the ELDC circuit, and is arranged to generate the feedback signal according to an output phase such as the output phase generated by the ELDC circuit. For example, the continuous-time sigma-delta modulator may further comprise an arithmetic circuit that is arranged to generate an intermediate signal according to the input signal of the continuous-time sigma-delta modulator and according to the feedback signal obtained through the DAC, where the intermediate signal may be used as the VCO input signal of the VCO-based quantizer. Examples of the arithmetic circuit may include, but not limited to, an adding circuit and a subtraction circuit. In some examples, all of the operations of the ELDC circuit may be carried out in the phase domain (PD), and therefore the ELDC circuit may be referred to as the phase domain ELDC (PD-ELDC) circuit.

It is an advantage of the present invention that the present invention continuous-time sigma-delta modulator can mitigate, alleviate or eliminate the related art problems.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating an exemplary operation of the STC shown in FIG. 2.

FIG. 8 is a diagram illustrating an exemplary operation of FIG. 7, where, no matter whether the XOR output is thermometer or not, RTSC outputs give identical results.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
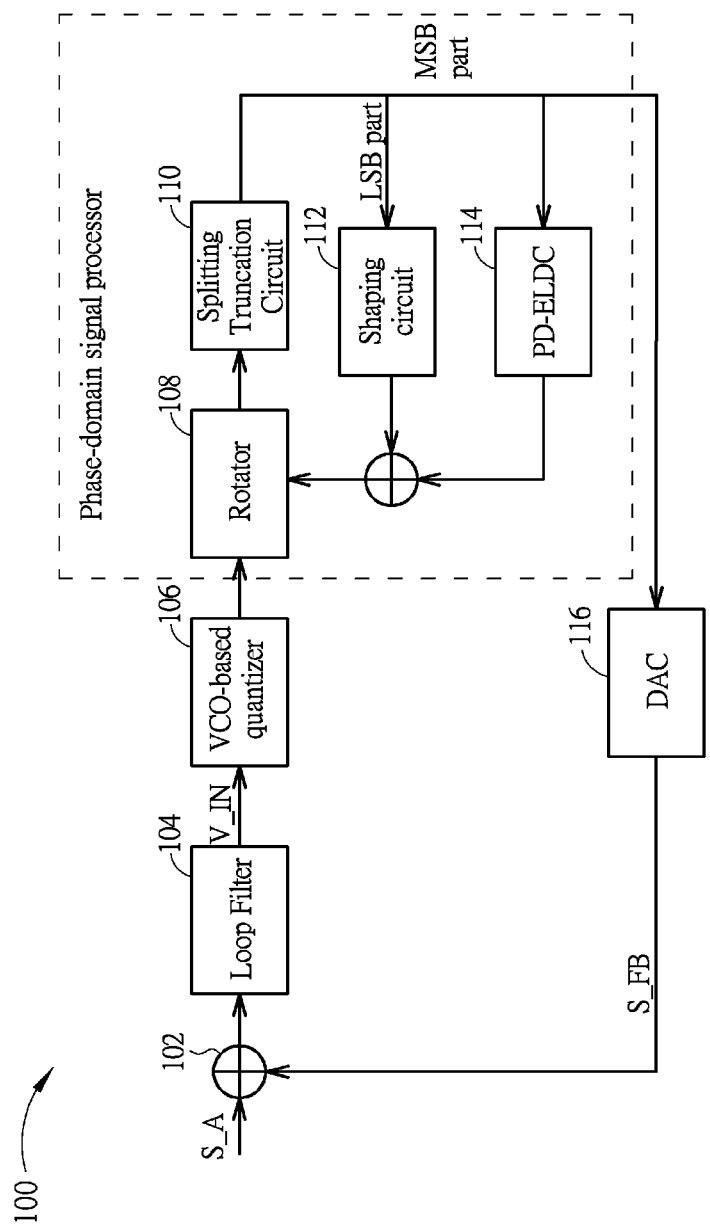
FIG. 1 is a block diagram illustrating a continuous-time sigma-delta analog-to-digital converter according to a first embodiment of the invention.

FIG. 1 is a block diagram illustrating a continuous-time sigma-delta analog-to-digital converter according to a first embodiment of the invention. The exemplary continuous-time sigma-delta analog-to-digital converter 100 includes, but is not limited to, an adder 102, a loop filter 104, a VCO-based quantizer 106, a rotator 108, a splitting truncation circuit (STC) 110, a shaping circuit 112, a phase-domain excess loop delay compensation (PD-ELDC) circuit 114 and a digital-to-analog converter (DAC) 116. The adder 102 is arranged for subtracting a feedback signal S_FB from an analog input signal S_A. For example, an inverter may be embedded in the adder 102 to invert an input such as the feedback signal S_FB, for converting an adding operation into a subtraction operation. This is for illustrative purposes only, and is not meant to be a limitation of the present invention. According to some embodiments of the present invention, the adder 102 may be implemented in another manner. For example, the inverter may be positioned outside the adder 102. According to some aspects of the present invention, the adder 102 may be regarded as a subtraction circuit when the inverter is embedded therein, or may be regarded as an adding circuit when the inverter is positioned outside the adder 102, where the adding circuit and the subtraction circuit may be collectively referred to as the arithmetic circuit, for brevity.

As shown in FIG. 1, the loop filter 104 is coupled to the adder 102, and is arranged for generating the input voltage V_IN according to an output of the adder 102. The rotator 108, the STC 110, the shaping circuit 112 and the PD-ELDC circuit 114 (labeled "PD-ELDC" in FIG. 1, for brevity) form a phase-domain signal processor (PSP). The STC 110 splits the thermometer code output from the rotator 108 into a most significant bit (MSB) part and a least significant bit (LSB) part depending on the truncation scheme and the specification of the 4-bit unary DAC 116 (labeled "DAC" in FIG. 1, for brevity). For instance, the total 16-bit thermometer code may be split into a 4-bit MSB part and 3-bit LSB part (all in thermometer). The 3-bit LSB part is fed into the shaping circuit 112, which can be represented by HA(z). The 4-bit MSB part is fed into the PD-ELDC circuit 114 and the 4-bit unary DAC 116, respectively. The output of the shaping circuit 112 and the PD-ELDC circuit 114 are summed up and input to the rotator 108 (for example, the thermometer to binary conversion may be required to combine the output of the shaping circuit 112 and the output of the PD-ELDC circuit 114); in this way, the thermometer code output from the VCO-based quantizer 106 can be appropriately adjusted in the phase-domain through the rotator 108. It should be noted that only the components pertinent to features of the present invention are shown in FIG. 1 for simplicity and clarity.

Figure 2:
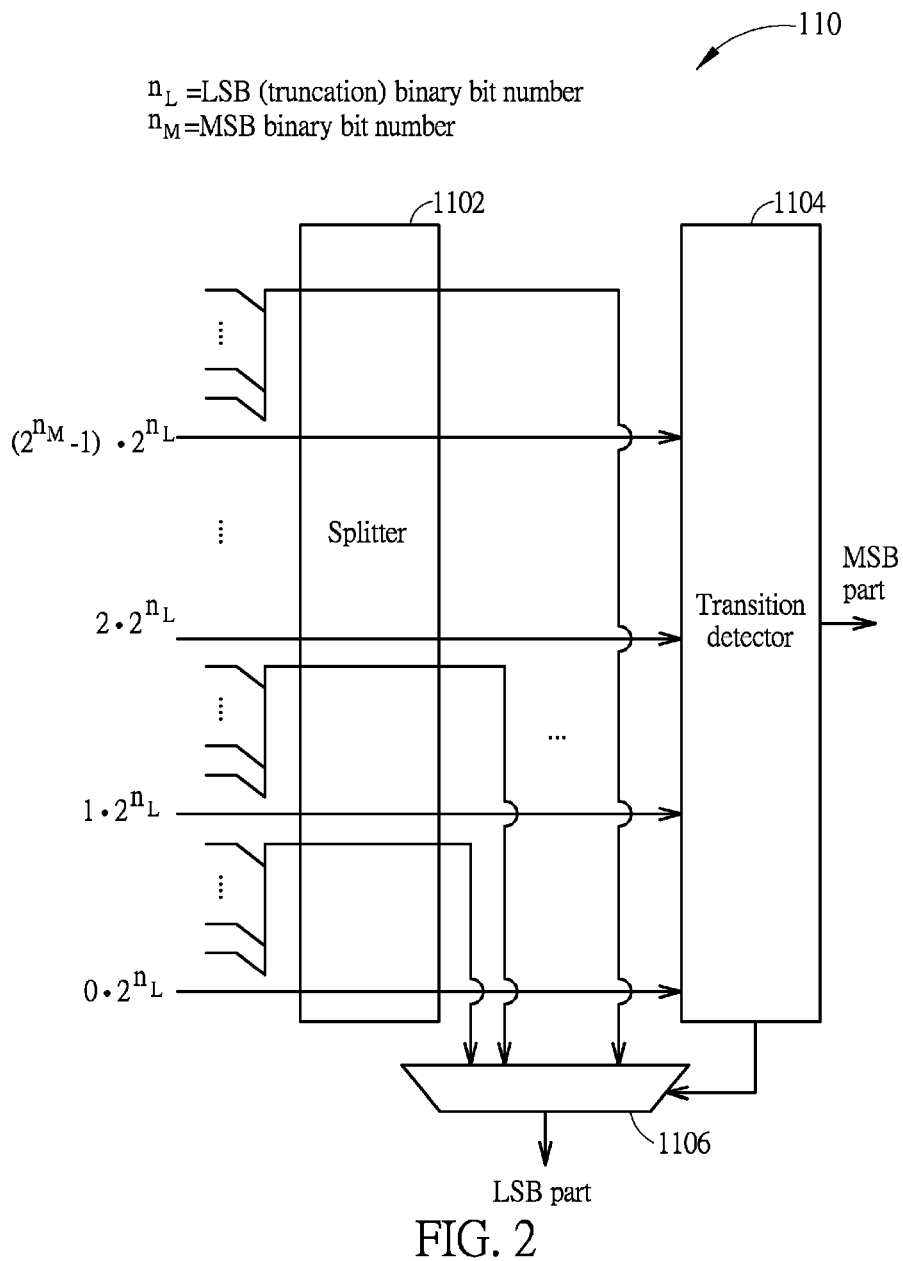
FIG. 2 is a block diagram illustrating a Splitting Truncation Circuit (STC) according to an embodiment of the invention.

Specifically, the truncation loop (path via the shaping circuit 112) and the ELDC loop (path via the PD-ELDC circuit 114) are similar for promptly performing compensation. Therefore, their compensations can be combined and applied to rotator 108. The thermometer code after a rotation process (i.e. the thermometer code output from the rotator 108) is in a pattern including only a single 0 to 1 transition. For example, the 16-bit thermometer code output from the rotator 108 may be 16'b0000_0000_0011_1111. Note that the proportion of 0s and 1s is not limited. FIG. 2 is a block diagram illustrating the STC 110 according to an embodiment of the invention. The STC 110 includes a splitter 1102, a transition detector 1104 and a multiplexer 1106. The thermometer code is input to the splitter 1102 from the left of the diagram, and the total bit number of the thermometer code is $2^{n_M+n_L}$, wherein $n_M$ is the bit number of the MSB part in binary code; and $n_L$ is the bit number of the LSB part in binary code.

The splitter 1102 passes MSB bits (ticks) in thermometer code $0 \cdot 2^{n_L}, 1 \cdot 2^{n_L}, 2 \cdot 2^{n_L}, \ldots, (2^{n_M}-1) \cdot 2^{n_L}$ to transition detector 1104 for determining the transition position of 0 to 1. The remaining LSB thermometer code sets are input to the multiplexer 1106, wherein the number of LSB thermometer code sets is $2^{n_M}$, and the LSB thermometer code set located exactly between the MSB bit 0 and the MSB bit 1 (i.e. the transition of 0 to 1) is selected by the output of the transition detector 1104 according to the output of the transition detector 1104. In the implementation, the main path (i.e. the feedback path via the DAC 116) delay overhead is the rotator 108 and the STC 110, which is simple and consumes little time as can be seen from the architecture in FIG. 2. Other digital signal processing performed on the truncation loop and ELDC loop has a time margin of a full clock cycle because they are placed at off the main feedback path.

FIG. 3 is a diagram illustrating an exemplary operation of the circuit shown in FIG. 2. The input thermometer code is 16'b0000_0000_0011_1111. The splitter 1102 passes the bit 12, bit 8, bit 4 and bit 0 of the input thermometer code, which is 4'b0011, to the transition detector 1104 as the MSB bit; and passes the LSB thermometer code sets 3'b000, 3'b000, 3'b001, 3'b111 to the multiplexer 1106. Consequently, the LSB thermometer code (3'b001) set between the bit 8 and bit 4 is obtained at the output of the multiplexer 1106 based on the indication of the transition detector 1104.

Figure 4:
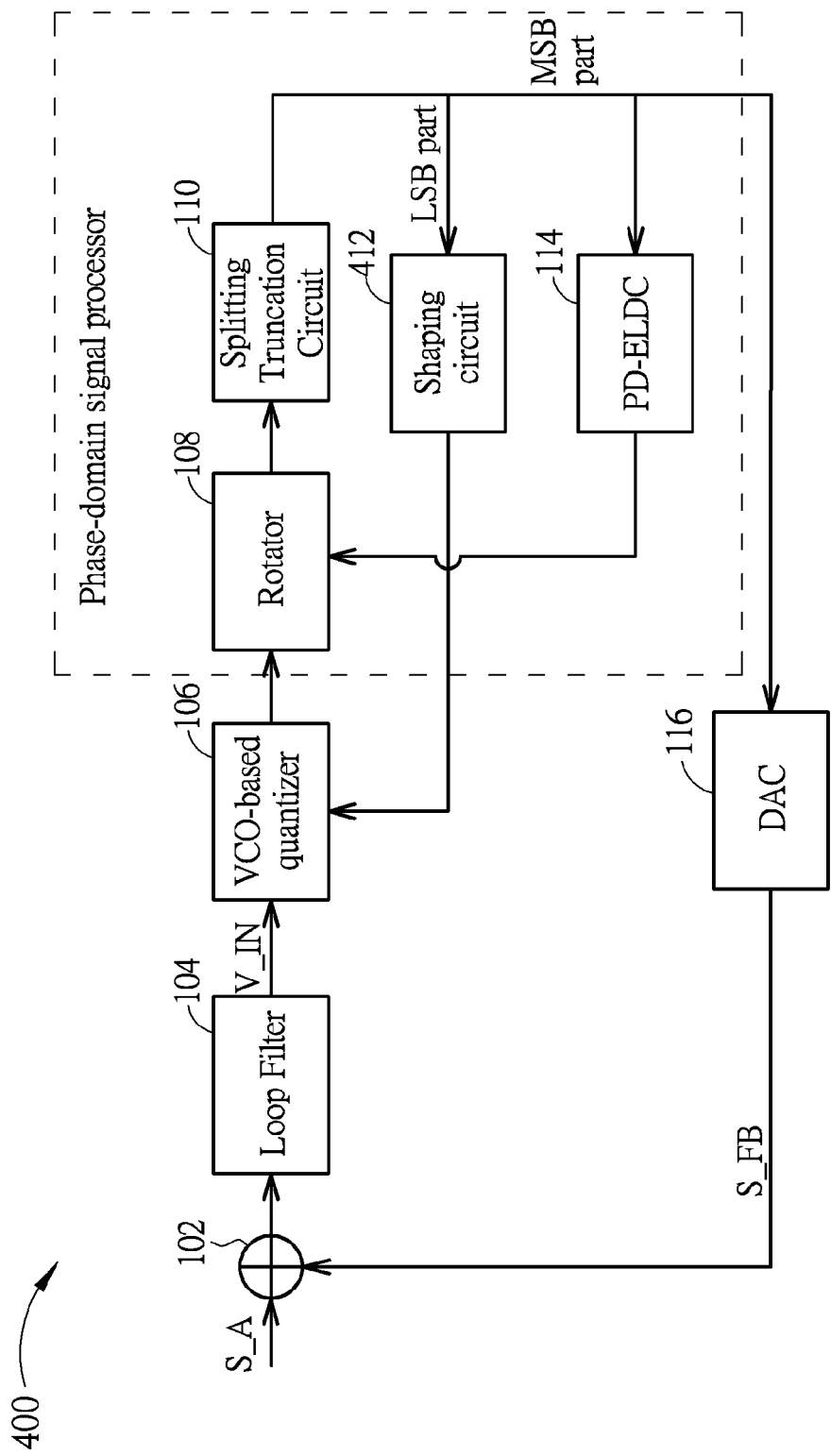
FIG. 4 is a block diagram illustrating a continuous-time sigma-delta analog-to-digital converter according to a second embodiment of the invention.

FIG. 4 is a block diagram illustrating a continuous-time sigma-delta analog-to-digital converter according to a second embodiment of the invention. The exemplary continuous-time sigma-delta analog-to-digital converter 400 is an alternative version of the continuous-time sigma-delta analog-to-digital converter 100. The difference between the two implementations is the shaping circuit 412 of the continuous-time sigma-delta analog-to-digital converter 400 feeds the compensation term to the sampling clock of the VCO-based quantizer 106 directly instead of the rotator 108.

Figure 5:
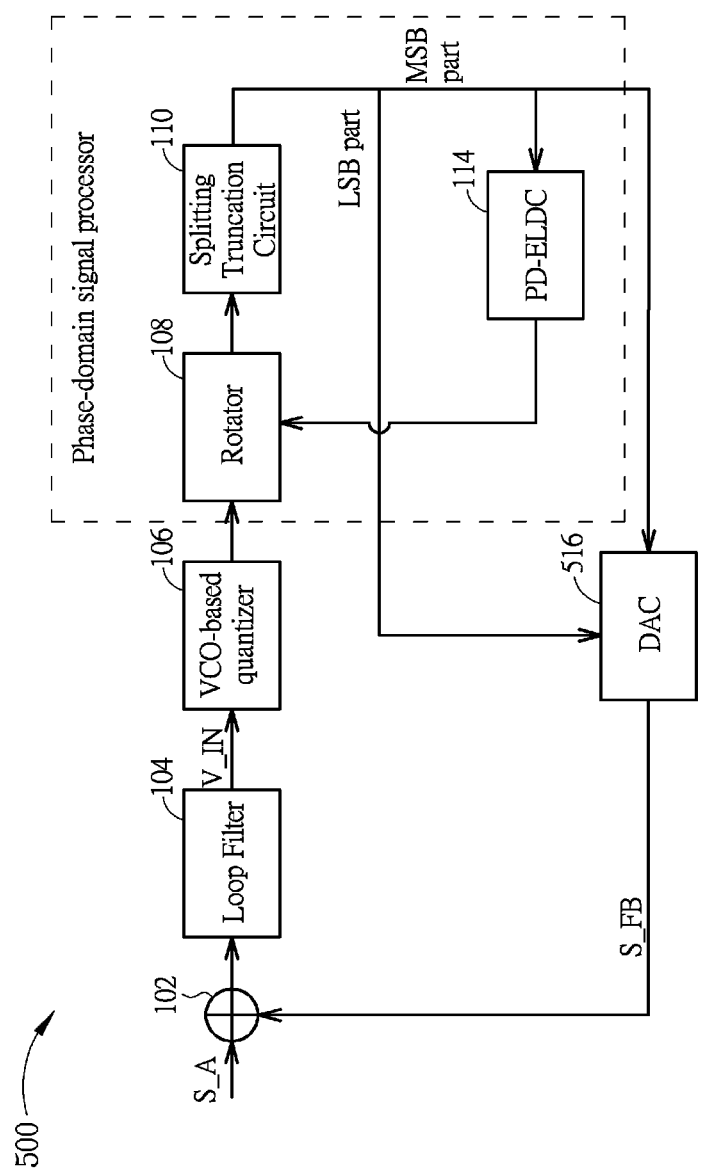
FIG. 5 is a block diagram illustrating a continuous-time sigma-delta analog-to-digital converter according to a third embodiment of the invention.

FIG. 5 is a block diagram illustrating a continuous-time sigma-delta analog-to-digital converter according to a third embodiment of the invention. The exemplary continuous-time sigma-delta analog-to-digital converter 500 is another alternative version of the continuous-time sigma-delta analog-to-digital converter 100. The difference between the two implementations is the LSB part is also fed into a DAC 516 of the continuous-time sigma-delta analog-to-digital converter 500 along with the MSB bit instead of into the path via the shaping circuit 112 as shown in FIG. 1. Consequently, all the information after the VCO-based quantizer 106 is kept intact without any truncation error introduced. For instance, when the total 128-bit thermometer code is split into a 4-bit MSB part and 3-bit LSB part by the STC 110, the 7-bit segmented DAC 516 (labeled "DAC" in FIG. 5, for brevity) will be needed.

Figure 6:
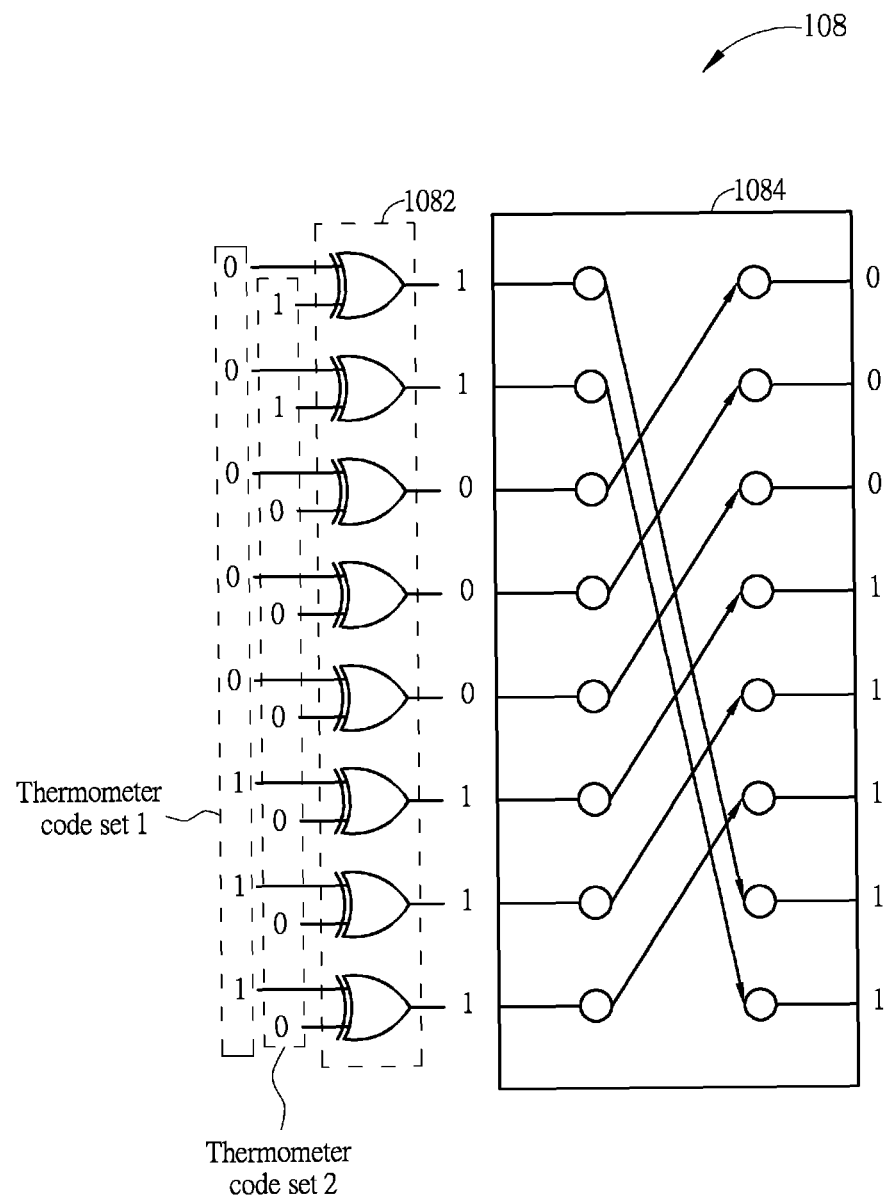
FIG. 6 is a diagram illustrating a rotator according to an embodiment of the invention.

FIG. 6 is a diagram illustrating one implementation of the rotator 108 according to an embodiment of the invention. The rotator 108 may comprise an array of XOR gates 1082 followed by a shuffler 1084. The data after the array of XOR gates 1082 are scrambled and lose the monotonicity as in a typical thermometer. Therefore, the shuffler 1084 is required to bring it back to the thermometric manner. Then, the STC 110 can be applied to separate the MSB and LSB parts. An N-bit thermometer code set 1 coming from the VCO-based quantizer 106 and an N-bit thermometer code set 2 coming from the feedback loop (which may include the ELDC loop plus the truncation circuit as shown in FIG. 1 or simply the ELDC loop as shown in FIG. 4 and FIG. 5) are jointly fed to the N XOR gates 1082, respectively. The thermometer code set 2 indicates a phase for compensating the thermometer code set 1. In other words, the thermometer code set output from the VCO-based quantizer 106 is rotated based on the thermometer code set 2. In an example shown in FIG. 6, the thermometer code set 1 is 8'b0000_0111 and the thermometer code set 2 is 8'b1100_0000. The rotated thermometer code set should be 2 code shifted version of the thermometer code set 1 as 8'b0001_1111. As mentioned above, the output of the plurality of XOR gates 1082 8'b1100_0111 needs a further switching circuit 1084 to rotate to the appropriate value 8'b0001_1111 for the downstream processing. The switching circuit 1084 is an N*N switch matrix for the N-bit thermometer code set. In a case where the thermometer code set is 8-bit, the switching circuit 1084 is an 8*8 switch matrix.

Figure 7:
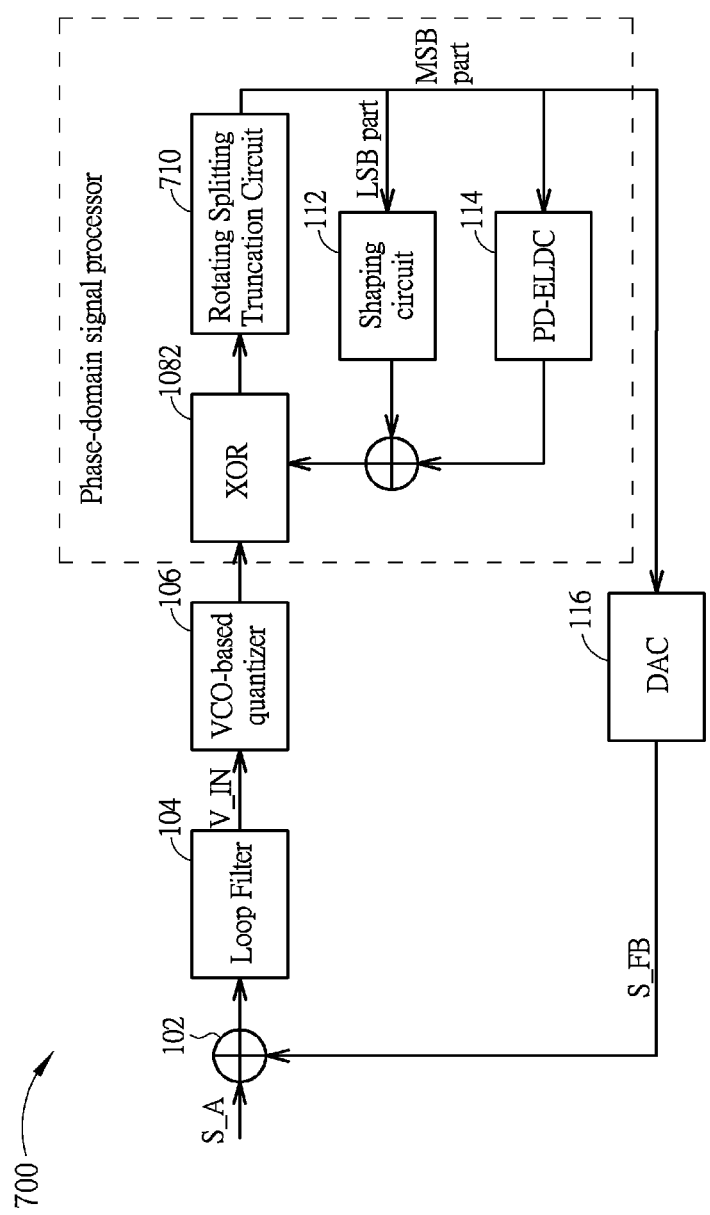
FIG. 7 is a block diagram illustrating a continuous-time sigma-delta analog-to-digital converter according to a fourth embodiment of the invention.

FIG. 7 is a block diagram illustrating a continuous-time sigma-delta analog-to-digital converter according to a fourth embodiment of the invention. The exemplary continuous-time sigma-delta analog-to-digital converter 700 is another alternative version of the continuous-time sigma-delta analog-to-digital converter 100. As mentioned above, the STC 110 can only deal with the standard thermometer code in a pattern which includes a single one 0 to 1 transition. Consequently, the rotator 108 has to include the complicated and hardware-consuming switching circuit 1084 to restore the code output by the XOR circuit such as the array of XOR gates 1082 (labeled "XOR" in FIG. 7, for brevity) to the standard thermometer code. In this embodiment, a rotating splitting truncation circuit (RSTC) 710 can deal with the scrambled thermometer code output directly by the XOR circuit such as the array of XOR gates 1082 in a simple and elegant manner. The operation is described in the following.

FIG. 8 is a diagram illustrating an exemplary operation of FIG. 7. Assuming the standard thermometer code obtained after compensation is 16'b0000_0000_0011_1111, then the scrambled thermometer code output by the XOR circuit such as the array of XOR gates 1082 may be 16'b0000_0001_1111_1000. Because the segmentation is 2-bit binary MSB part and 2-bit binary LSB part, the total 16-bit thermometer code is split into a 4-bit thermometer MSB part and 3-bit thermometer LSB part. The RSTC 710 first extracts the 4-bit thermometer MSB part (i.e. bit 0, bit 4, bit 8, bit 12), such as 4'b0110 in this example. Because the weighting of each 1 in MSB part is 4 and there are two is in 4'b0110, the value of the MSB part can be expressed as follows:

4*2=8.

The RSTC 710 then identifies 0–1 transition and 1–0 transition of the 4-bit MSB part (i.e. bit 0, bit 4, bit 8, bit 12), and sums the three LSB parts in each transition region to generate the LSB sum. For example, the thermometer LSB in 0–1 transition is 3'b000 and the sum can be expressed as follows:

0*1=0.

On the other hand, the thermometer LSB in –0 transition is 3'b100 and the sum can be expressed as follows:

1*1=1.

The last step is to add a predetermined offset. The final output can be expressed as follows:

8(MSB sum)+0(LSB sum in 0–1 transition)+1(LSB sum in 1–0 transition)–3(predetermined offset)=6;

as the total number of is in the original 16-bit thermometer code.

It is more advantageous to use the XOR circuit such as the array of XOR gates 1082 plus the RSTC 710 to replace the rotator 108 and the STC 110 of FIGS. 1, 4 and 5 if the rotator 108 is implemented based on XOR operation(s), because the switching circuit 1084 of the rotator 108 is complicated and hardware-consuming compared with the RSTC 710. The delay of the main path (i.e. the feedback path via the DAC 116) can be further reduced especially for a CTSDM having a high bit-count quantizer.

Please note that there are other ways to implement the rotator 108, and the implementation thereof is not restricted to XOR-based.

Figure 9:
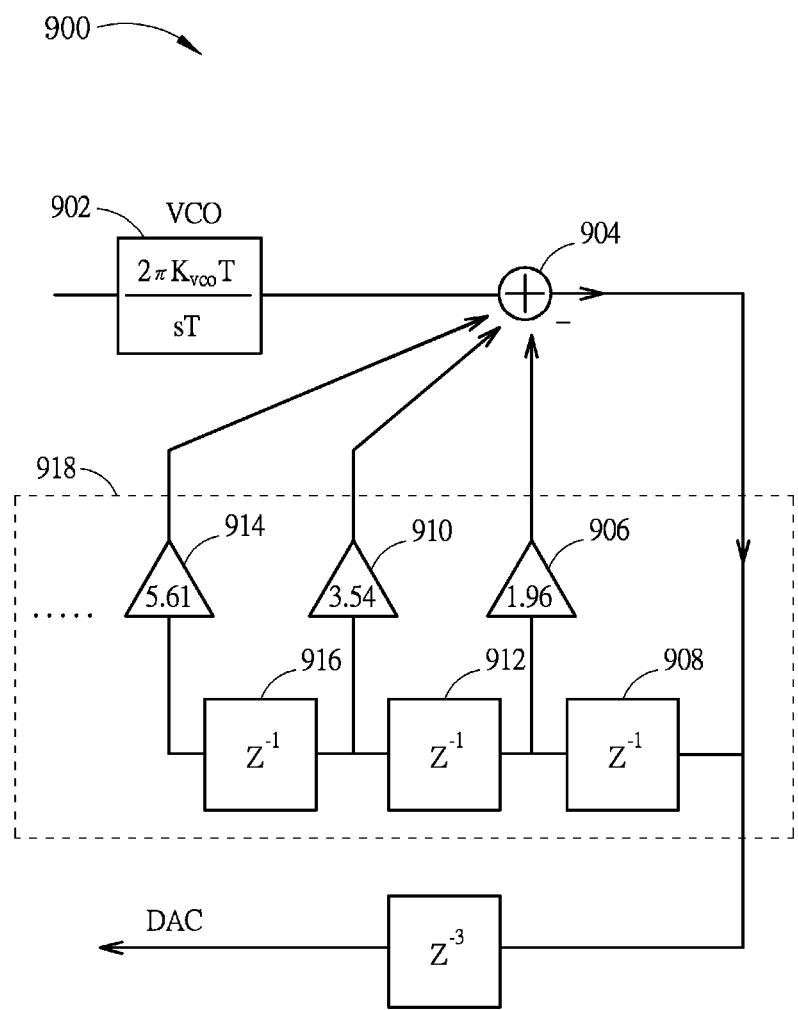
FIG. 9 is a block diagram illustrating a PD-ELDC according to an exemplary embodiment of the invention.
Figure 10:
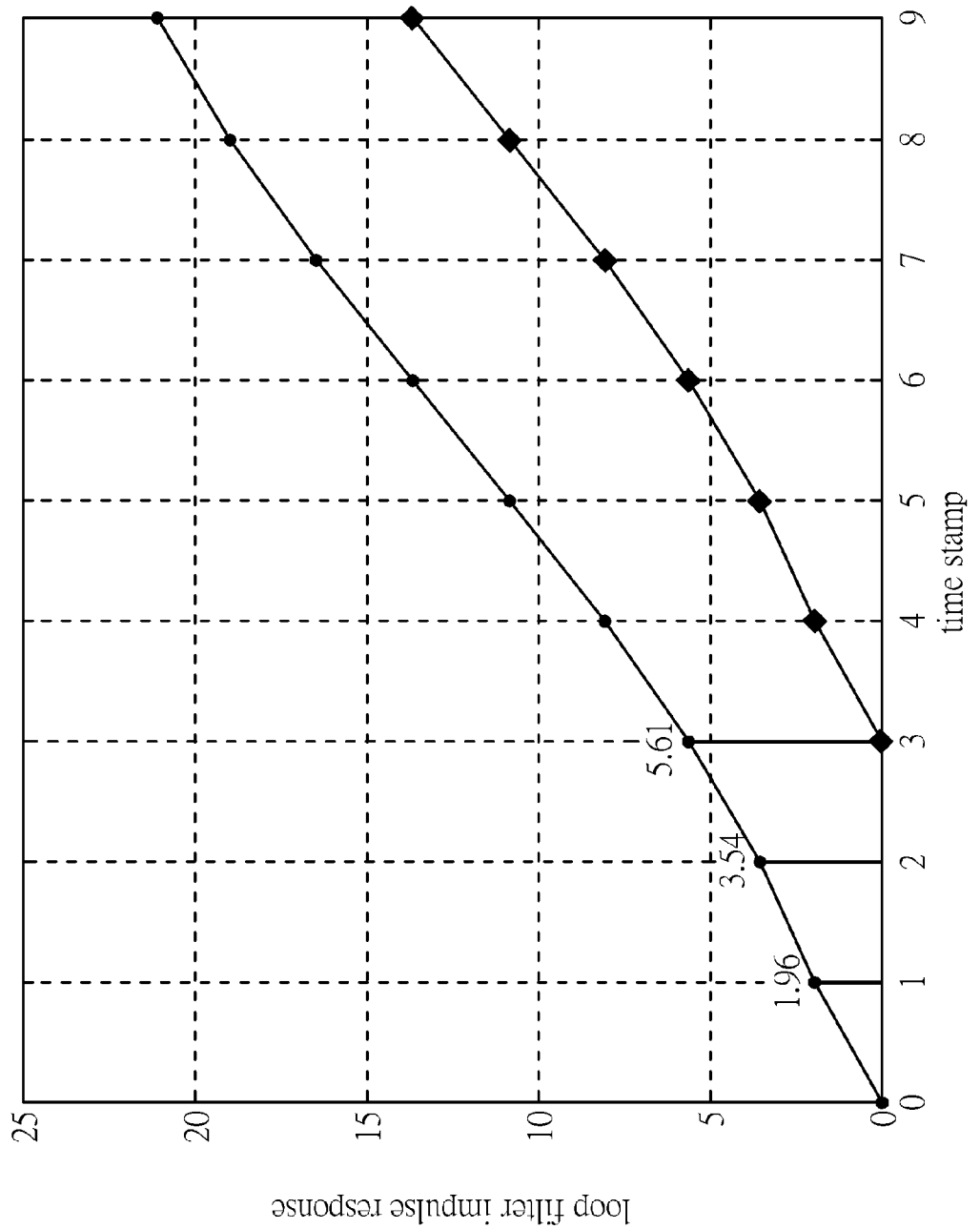
FIG. 10 is a diagram illustrating loop filter impulse responses with and without 3T loop delay, where the ELDC in FIG. 9 can be used to compensate these extra loop delays.

FIG. 9 is a block diagram illustrating a PD-ELDC according to an exemplary embodiment of the invention. The exemplary PD-ELDC 900 can be applied to the continuous-time sigma-delta analog-to-digital converter 100, 400, 500 and 700, but this is not a limitation of the invention. The PD-ELDC 900 can be further applied to other continuous-time sigma-delta analog-to-digital converters which do not have STCs or RSTCs. The only requirement is the operation must be in the phase-domain. Because the nature of wrap-around in the phase domain (always in between 0 and $2\pi$), there is no clipping of the signals as in the voltage domain. The PD-ELDC 900 includes, but is not limited to, a quantizer 902 (e.g. a VCO-based quantizer), an adder 904, a first tap 906, a second tap 910, a third tap 914, a delay circuit 918 and 3 unit delay circuits 908, 912 and 916. The first tap 906, the second tap 910 and the third tap 914 are determined based on the impulse response in advance. Utilizing 3 taps is based on the premise that the delay time from the output of the VCO-based quantizer 902 to the downstream DAC is approximately 3 clock cycles. Thus, the phase delay can be compensated by the PD-ELDC 900. In some embodiments, the concept can be extended to more than 3 clock cycle delay. The loop filter impulse responses before and after the PD-ELDC 900 are shown in FIG. 10.

Delay of multiple clock cycles around the closed loop can lead to an enormous signal swing at the output of the quantizer 902 no matter whether the CTSDM is VCO-based or non VCO-based. However, the VCO-based quantizer output of the VCO-based CTSDM is naturally cyclic within a period of $2\pi$ and consequently the VCO-based quantizer output of the VCO-based CTSDM is folded after exceeding the basic range. The essence of PD-ELDC is the phase-domain operation. The quantizer output of the non VCO-based CTSDM has no such feature, however, which easily leads to an overflow condition. As a result, the PD-ELDC 900 has the potential to compensate more than 1 clock cycle delay.

Figure 11:
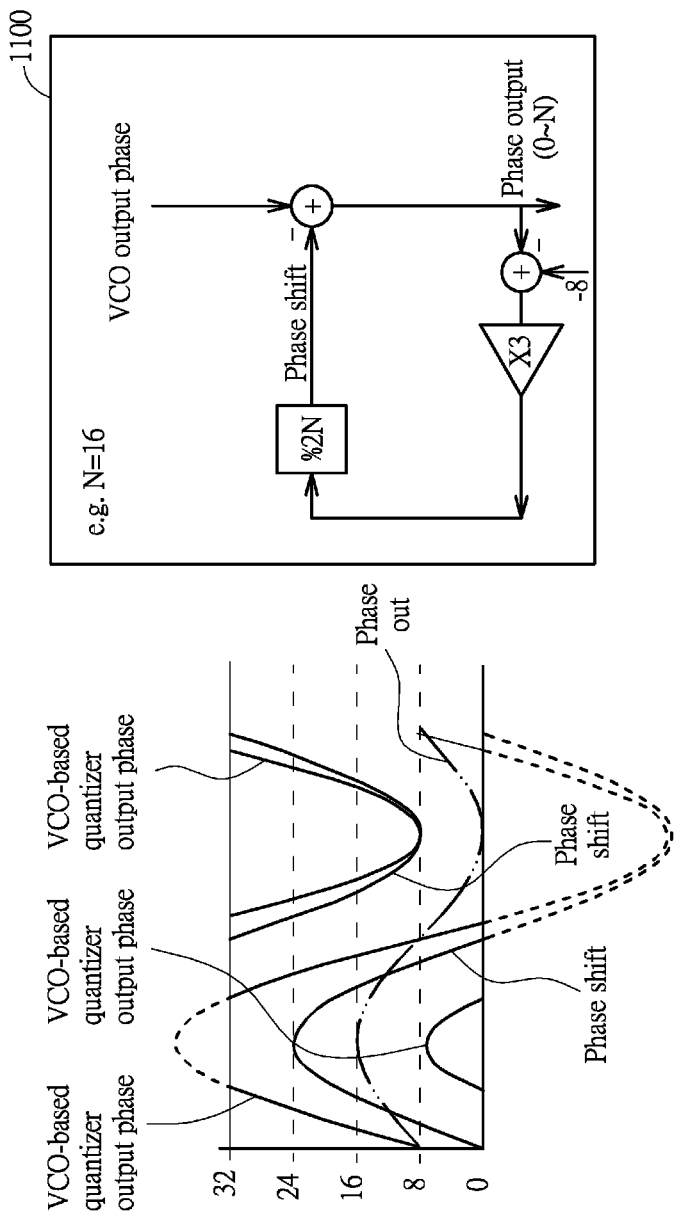
FIG. 11 illustrates a conceptual example of a PD-ELDC and a corresponding waveform plot, where the VCO-based quantizer output phase is folded instead of being clipped.

FIG. 11 illustrates an example of a PD-ELDC and a corresponding waveform plot. In this example, VCO has 16 stages and 32 states. The state 0 corresponds to phase 0, the state 16 corresponds to phase $\pi$, and the state 32 corresponds to phase $2\pi$. The figure illustrates that the VCO-based quantizer output of the one tap PD-ELDC 1100 exceeds the desired range 0-32, and some parts of the VCO-based quantizer output are folded, which is substantially equal to a modulus $2\pi$ operation. After being compensated by the loopback path via the tap, the phase output between 0-16 can be obtained. Theoretically, PD-ELDC can shift VCO output by any amount without clipping.

Figure 12:
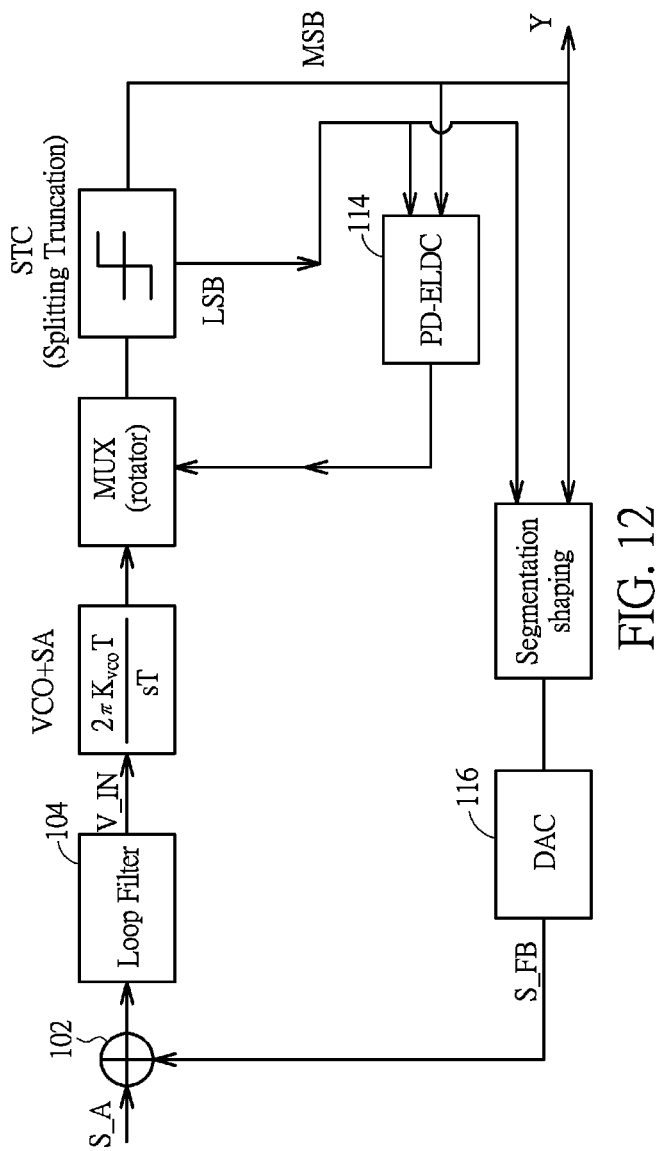
FIG. 12 is a block diagram illustrating a continuous-time sigma-delta analog-to-digital converter according to another embodiment of the invention.

FIG. 12 is a block diagram illustrating a continuous-time sigma-delta analog-to-digital converter according to another embodiment of the invention. Some components within the continuous-time sigma-delta analog-to-digital converter of this embodiment can be the same as that of the embodiment shown in FIG. 7, and the quantizer that is next to the loop filter 104 can be similar to that of a quantizer 902. Please note that the paths for the LSB part and the MSB part in this embodiment are those labeled "LSB" and "MSB" respectively. According to this embodiment, by using the segmentation shaping circuit (labeled "Segmentation shaping" in FIG. 12, for brevity), segmentation shaping can be applied to shape the mismatch between MSB and LSB DAC inputs of the DAC 116. For brevity, similar descriptions for this embodiment are not repeated in detail here. This is for illustrative purposes only, and is not meant to be a limitation of the present invention. According to some embodiments, the segmentation shaping may not be necessary and can be replaced with other mechanism such as DAC calibration.

Figure 13:
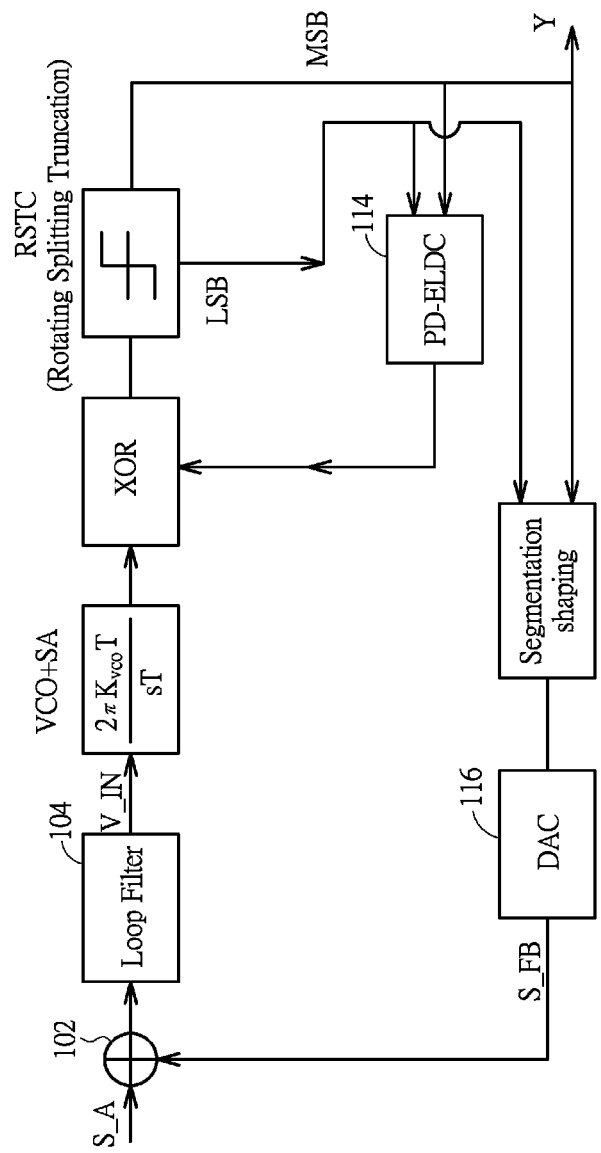
FIG. 13 is a block diagram illustrating a continuous-time sigma-delta analog-to-digital converter according to another embodiment of the invention.

FIG. 13 is a block diagram illustrating a continuous-time sigma-delta analog-to-digital converter according to another embodiment of the invention. Some components within the continuous-time sigma-delta analog-to-digital converter of this embodiment can be the same as that of the embodiment shown in FIG. 7, and the quantizer that is next to the loop filter 104 can be similar to that of a quantizer 902. Please note that the paths for the LSB part and the MSB part in this embodiment are those labeled "LSB" and "MSB" respectively. According to this embodiment, by using the segmentation shaping circuit (labeled "Segmentation shaping" in FIG. 13, for brevity), segmentation shaping can be applied to shape the mismatch between MSB and LSB DAC inputs of the DAC 116. For brevity, similar descriptions for this embodiment are not repeated in detail here. This is for illustrative purposes only, and is not meant to be a limitation of the present invention. According to some embodiments, the segmentation shaping may not be necessary and can be replaced with other mechanism such as DAC calibration In some embodiments, the shaping circuit that is coupled between the rotator and the truncation circuit may be arranged to generate the phase shift based on the LSB part, where the LSB part may be frequency-shaped to high frequency, such as a frequency higher than the original frequency thereof.

In some embodiments, the shaping circuit that is coupled between the VCO-based quantizer and the truncation circuit may be arranged to generate the phase shift based on the LSB part, where the LSB part may be frequency-shaped to high frequency, such as a frequency higher than the original frequency thereof.

In some embodiments, the number of bit transition positions detected by the transition detector may be equal to or greater than two.

In some embodiments, multiple LSB parts may be detected with aid of the transition detector, and may be sent to the DAC 116 or the XOR circuit such as the array of XOR gates 1082 after applying the processing of the RSTC 710. For example, during the processing of the RSTC 710, a predetermined offset such as that mentioned above may be added to adjust a final output such as that mentioned above.

In some embodiments, the LSB generator within the truncation circuit may be arranged to generate the LSB part, and the MSB part and the LSB part can be both sent to the ELDC circuit (such as the PD-ELDC shown in FIG. 9) in a situation where the processing of the STC 110 or the processing of the RSTC 710 is applied.

In some embodiments, such as those shown in FIGS. 12 and 13, segmentation shaping can be applied to shape the mismatch between MSB and LSB DAC inputs of these embodiments.

In some embodiments, a ELDC circuit within the continuous-time sigma-delta modulator of these embodiments may be a phase domain ELDC (PD-ELDC) circuit such as the one tap PD-ELDC 1100 shown in FIG. 11. For example, this PD-ELDC circuit such as the one tap PD-ELDC 1100 shown in FIG. 11 may be arranged to perform a modulus operation on an intermediate signal to generate a phase shift, and generate an output phase (e.g. the phase output shown in FIG. 11) according to the phase shift.

The aforementioned inventive concept can be applied by a semiconductor manufacturer to any integrated circuit comprising a radio frequency and/or synchronous clock application. It is further envisaged that a semiconductor manufacturer may employ the inventive concept in a standalone device, application-specific integrated circuit (ASIC) and/or any other sub-system element.

Aspects of the invention may be implemented in any suitable form including hardware, software, firmware or any combination of these. The invention may optionally be implemented, at least partly, as computer software running on one or more data processors and/or digital signal processors or configurable circuit components such as FPGA devices. Thus, the elements and components of an embodiment of the invention may be physically, functionally and logically implemented in any suitable way. The functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor or controller. Additionally, although individual features may be included in different claims, these may possibly be advantageously combined, and the inclusion in different claims does not imply that a combination of features is not feasible and/or advantageous. The inclusion of a feature in one category of claims does not imply a limitation to this category, but rather indicates that the feature is equally applicable to other claim categories, as appropriate.

The order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Improved truncation circuit for a CTSDM have been described, wherein the aforementioned disadvantages with prior art arrangements have been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A continuous-time sigma-delta modulator, comprising:
   a VCO-based quantizer, arranged to generate a thermometer code based on an input signal and a feedback signal;
   a rotator, coupled to the VCO-based quantizer, arranged to generate a phase-shifted thermometer code based on the thermometer code and a phase shift, and generate a rearranged thermometer code based on the phase-shifted thermometer code to comply with a specific pattern;
   a truncation circuit, coupled to the rotator, arranged to extract a most significant bit (MSB) part from the rearranged thermometer code, wherein bits with a specific bit interval of the rearranged thermometer code are determined to be the MSB part, remaining bits of the rearranged thermometer code are determined to be a least significant bit (LSB) set, and the truncation circuit comprises:
      a transition detector, arranged to determine a 0 and 1 bit transition position of the MSB part and generate a transition position; and
      a multiplexer, arranged to determine a LSB part from the LSB set according to the transition position; and
   a digital-to-analog converter (DAC), coupled to the truncation circuit, arranged to generate the feedback signal according to at least the MSB part.

2. The continuous-time sigma-delta modulator of claim 1, wherein the specific bit interval of the rearranged thermometer code is determined based on a truncation bit number.

3. The continuous-time sigma-delta modulator of claim 1, wherein the specific pattern includes at most a single 0 and 1 bit transition.

4. The continuous-time sigma-delta modulator of claim 1, further comprising:
   an excess loop delay compensation (ELDC) circuit, coupled between the rotator and the truncation circuit, wherein the ELDC circuit is arranged to generate the phase shift to the rotator based on the MSB part.

5. A continuous-time sigma-delta modulator, comprising:
   a VCO-based quantizer, arranged to generate a thermometer code based on an input signal and a feedback signal;
   a rotator, coupled to the VCO-based quantizer, arranged to generate a phase-shifted thermometer code based on the thermometer code and a phase shift, and generate a rearranged thermometer code based on the phase-shifted thermometer code to comply with a specific pattern;
   a truncation circuit, coupled to the rotator, arranged to extract a most significant bit (MSB) part from the rearranged thermometer code, wherein the truncation circuit is further arranged to extract a least significant bit (LSB) part from the rearranged thermometer code;
   a shaping circuit, coupled between the rotator and the truncation circuit, wherein the shaping circuit is arranged to generate the phase shift to the rotator based on the LSB part; and
   a digital-to-analog converter (DAC), coupled to the truncation circuit, arranged to generate the feedback signal according to at least the MSB part.

6. The continuous-time sigma-delta modulator of claim 5, wherein the LSB part is frequency-shaped to high frequency.

7. A continuous-time sigma-delta modulator, comprising:
   a VCO-based quantizer, arranged to generate a thermometer code based on an input signal and a feedback signal;
   a rotator, coupled to the VCO-based quantizer, arranged to generate a phase-shifted thermometer code based on the thermometer code and a phase shift, and generate a rearranged thermometer code based on the phase-shifted thermometer code to comply with a specific pattern;

a truncation circuit, coupled to the rotator, arranged to extract a most significant bit (MSB) part from the rearranged thermometer code, wherein the truncation circuit is further arranged to extract a least significant bit (LSB) part from the rearranged thermometer code;

a shaping circuit, coupled between the VCO-based quantizer and the truncation circuit, wherein the shaping circuit is arranged to generate the phase shift based on the LSB part; and a digital-to-analog converter (DAC), coupled to the truncation circuit, arranged to generate the feedback signal according to at least the MSB part.

8. The continuous-time sigma-delta modulator of claim 7, wherein the LSB part is frequency-shaped to high frequency.

9. A continuous-time sigma-delta modulator, comprising:
a VCO-based quantizer, arranged to generate a thermometer code based on an input signal and a feedback signal;
a rotator, coupled to the VCO-based quantizer, arranged to generate a phase-shifted thermometer code based on the thermometer code and a phase shift, and generate a rearranged thermometer code based on the phase-shifted thermometer code to comply with a specific pattern;
a truncation circuit, coupled to the rotator, arranged to extract a most significant bit (MSB) part from the rearranged thermometer code, wherein the truncation circuit is further arranged to extract a least significant bit (LSB) part from the rearranged thermometer code; and
a digital-to-analog converter (DAC), coupled to the truncation circuit, arranged to generate the feedback signal according to at least the MSB part, wherein the DAC is arranged to generate the feedback signal according to the MSB part and the LSB part.

10. The continuous-time sigma-delta modulator of claim 1, wherein the rotator comprises:
an XOR circuit, arranged to generate the phase-shifted thermometer code by performing an XOR operation on the thermometer code and the phase shift; and
a switch circuit, arranged to generate the rearranged thermometer code based on the phase-shifted thermometer code to comply with the specific pattern.

11. A continuous-time sigma-delta modulator, comprising:
a VCO-based quantizer, arranged to generate a thermometer code based on an input signal and a feedback signal;
an XOR circuit, arranged to generate a phase-shifted thermometer code by performing an XOR operation on the thermometer code and a phase shift;
a truncation circuit, coupled to the XOR circuit, arranged to extract a most significant bit (MSB) part from the phase-shifted thermometer code, wherein the truncation circuit is arranged to generate the MSB part according to a sum of bits with a specific bit interval of the phase-shifted thermometer code and a truncation bit number, remaining bits of the phase-shifted thermometer code are determined to be a least significant bit (LSB) set, and the truncation circuit comprises:
a bit extension circuit, arranged to extend the phase-shifted thermometer code by inserting a bit duplicated from a least significant bit of the phase-shifted thermometer code to a bit position higher than a most significant bit of the phase-shifted thermometer code;
a transition detector, arranged to determine a 0 to 1 bit transition position and a 1 to 0 bit transition position of the bits with the specific bit interval of the bit extended phase-shifted thermometer code and generate a first transition position and a second transition position;
a multiplexer, arranged to determine a first LSB result and a second LSB result from the LSB set according to the first transition position and the second transition position; and
a LSB generator, arranged to generate a LSB part according to the first LSB result and the second LSB result; and
a digital-to-analog converter (DAC), coupled to the truncation circuit, arranged to generate the feedback signal according to at least the MSB part.

12. The continuous-time sigma-delta modulator of claim 11, wherein the specific bit interval of the phase-shifted thermometer code is determined based on the truncation bit number.

13. A continuous-time sigma-delta modulator, comprising:
a VCO-based quantizer, arranged to generate a thermometer code based on an input signal and a feedback signal;
an XOR circuit, arranged to generate a phase-shifted thermometer code by performing an XOR operation on the thermometer code and a phase shift;
a truncation circuit, coupled to the XOR circuit, arranged to extract a most significant bit (MSB) part from the phase-shifted thermometer code, wherein the truncation circuit is arranged to generate the MSB part according to a sum of bits with a specific bit interval of the phase-shifted thermometer code, and remaining bits of the phase-shifted thermometer code are determined to be a least significant bit (LSB) set, and the truncation circuit comprises:
a transition detector, arranged to determine a 0 to 1 bit transition position and a 1 to 0 bit transition position of the bits with the specific bit interval of the bit extended phase-shifted thermometer code and generate a first transition position and a second transition position;
a multiplexer, arranged to determine a first LSB result and a second LSB result from the LSB set according to the first transition position and the second transition position; and
a LSB generator, arranged to generate a LSB part according to the first LSB result and the second LSB result; and
a digital-to-analog converter (DAC), coupled to the truncation circuit, arranged to generate the feedback signal according to at least the MSB part.

14. The continuous-time sigma-delta modulator of claim 13, wherein a number of bit transition positions detected by the transition detector is equal to or greater than two.

15. The continuous-time sigma-delta modulator of claim 13, wherein multiple LSB parts are detected with aid of the transition detector, and are sent to the DAC or the XOR circuit after applying processing of a rotating splitting truncation circuit (RSTC) within the continuous-time sigma-delta modulator.

16. The continuous-time sigma-delta modulator of claim 15, wherein during the processing of the RSTC, a predetermined offset is added to adjust a final output.

17. The continuous-time sigma-delta modulator of claim 11, further comprising:
an excess loop delay compensation (ELDC) circuit, coupled between the XOR circuit and the truncation circuit, wherein the ELDC circuit is arranged to generate the phase shift to the XOR circuit based on the MSB part.

18. A continuous-time sigma-delta modulator, comprising:
a VCO-based quantizer, arranged to generate a thermometer code based on an input signal and a feedback signal;
an XOR circuit, arranged to generate a phase-shifted thermometer code by performing an XOR operation on the thermometer code and a phase shift;
a truncation circuit, coupled to the XOR circuit, arranged to extract a most significant bit (MSB) part from the phase-shifted thermometer code, wherein a least significant bit (LSB) generator within the truncation circuit is arranged to generate a LSB part;
an excess loop delay compensation (ELDC) circuit, coupled between the XOR circuit and the truncation circuit, wherein the ELDC circuit is arranged to generate the phase shift to the XOR circuit based on the MSB part, and the MSB part and the LSB part are both sent to the ELDC circuit in a situation where processing of a splitting truncation circuit (STC) within the continuous-time sigma-delta modulator or processing of a rotating splitting truncation circuit (RSTC) within the continuous-time sigma-delta modulator is applied; and
a digital-to-analog converter (DAC), coupled to the truncation circuit, arranged to generate the feedback signal according to at least the MSB part.

19. A continuous-time sigma-delta modulator, comprising:
a VCO-based quantizer, arranged to generate a thermometer code based on an input signal and a feedback signal;
an XOR circuit, arranged to generate a phase-shifted thermometer code by performing an XOR operation on the thermometer code and a phase shift a truncation circuit, coupled to the XOR circuit, arranged to extract a most significant bit (MSB) part from the phase-shifted thermometer code;
an excess loop delay compensation (ELDC) circuit, coupled between the XOR circuit and the truncation circuit, wherein the ELDC circuit is arranged to generate the phase shift to the XOR circuit based on the MSB part; and
a digital-to-analog converter (DAC), coupled to the truncation circuit, arranged to generate the feedback signal according to at least the MSB part, wherein segmentation shaping is applied to shape mismatch between MSB and least significant bit (LSB) DAC inputs of the DAC.

20. A continuous-time sigma-delta modulator, comprising:
a VCO-based quantizer, arranged to generate a thermometer code based on an input signal and a feedback signal;
an XOR circuit, arranged to generate a phase-shifted thermometer code by performing an XOR operation on the thermometer code and a phase shift;
a truncation circuit, coupled to the XOR circuit, arranged to extract a most significant bit (MSB) part from the phase-shifted thermometer code, wherein the truncation circuit is further arranged to extract a least significant bit (LSB) part from the phase-shifted thermometer code;
a shaping circuit, coupled between the XOR circuit and the truncation circuit, wherein the shaping circuit generates the phase shift to the XOR circuit based on the LSB part; and
a digital-to-analog converter (DAC), coupled to the truncation circuit, arranged to generate the feedback signal according to at least the MSB part.

21. A continuous-time sigma-delta modulator, comprising:
a VCO-based quantizer, arranged to generate a thermometer code based on an input signal and a feedback signal;
an XOR circuit, arranged to generate a phase-shifted thermometer code by performing an XOR operation on the thermometer code and a phase shift;
a truncation circuit, coupled to the XOR circuit, arranged to extract a most significant bit (MSB) part from the phase-shifted thermometer code, wherein the truncation circuit is further arranged to extract a least significant bit (LSB) part from the phase-shifted thermometer code;
a shaping circuit, coupled between the VCO-based quantizer and the truncation circuit, wherein the shaping circuit is arranged to generate the phase shift based on the LSB part; and
a digital-to-analog converter (DAC), coupled to the truncation circuit, arranged to generate the feedback signal according to at least the MSB part.

22. A continuous-time sigma-delta modulator, comprising:
a VCO-based quantizer, arranged to generate a thermometer code based on an input signal and a feedback signal;
an XOR circuit, arranged to generate a phase-shifted thermometer code by performing an XOR operation on the thermometer code and a phase shift;
a truncation circuit, coupled to the XOR circuit, arranged to extract a most significant bit (MSB) part from the phase-shifted thermometer code, wherein the truncation circuit is further arranged to extract a least significant bit (LSB) part from the phase-shifted thermometer code; and
a digital-to-analog converter (DAC), coupled to the truncation circuit, arranged to generate the feedback signal according to the MSB part and the LSB part.

23. A continuous-time sigma-delta modulator, comprising:
a VCO-based quantizer, arranged to generate a thermometer code in a phase domain based on an input signal and a feedback signal;
an excess loop delay compensation (ELDC) circuit, having a plurality of taps arranged to jointly generate an output phase, wherein the ELDC circuit comprises:
an adder, coupled to at least one output of the VCO-based quantizer and outputs of the taps; and
a delay circuit, coupled to the adder, wherein the delay circuit comprises:
the plurality of taps, each having an input and an output and a plurality of unit delay circuits, coupled to an output of the adder, wherein the taps are coupled to the unit delay circuits, respectively; and a digital-to-analog converter (DAC), coupled to the ELDC circuit, arranged to generate the feedback signal according to the output phase, wherein an input of the DAC is coupled to the output of the adder.

24. The continuous-time sigma-delta modulator of claim 23, wherein a time delay between the VCO-based quantizer and the DAC is a plurality of clock cycles.

25. The continuous-time sigma-delta modulator of claim 23, wherein the ELDC circuit is a phase domain ELDC (PD-ELDC) circuit; and the PD-ELDC circuit is arranged to perform a modulus operation on an intermediate signal to generate a phase shift, and generate the output phase according to the phase shift.

* * * * *